United States Patent [19]
Yagi et al.

[11] Patent Number: 5,701,079
[45] Date of Patent: Dec. 23, 1997

[54] CONNECTOR TERMINAL CHECKING DEVICE

[75] Inventors: Sakai Yagi; Tamio Watanabe; Toru Nagano, all of Shizuoka, Japan

[73] Assignee: Yazaki Corporation, Tokyo, Japan

[21] Appl. No.: 688,763

[22] Filed: Jul. 31, 1996

[30] Foreign Application Priority Data

Aug. 2, 1995 [JP] Japan .................. 7-197688

[51] Int. Cl.[6] .................................. H01H 32/04
[52] U.S. Cl. .................. 324/538; 439/489; 439/912
[58] Field of Search .................. 439/489, 912; 324/538

[56] References Cited

U.S. PATENT DOCUMENTS

| | | | |
|---|---|---|---|
| 5,108,305 | 4/1992 | Suzuki | 324/538 |
| 5,335,413 | 8/1994 | Yamamoto | 324/538 |
| 5,512,833 | 4/1996 | Fukuda | 324/538 |

FOREIGN PATENT DOCUMENTS

| | | |
|---|---|---|
| 61-131386 | 6/1986 | Japan . |
| 6-45042 | 2/1994 | Japan . |

Primary Examiner—Ernest F. Karlsen
Assistant Examiner—Jose M. Solis
Attorney, Agent, or Firm—Armstrong, Westerman, Hattori, McLeland & Naughton

[57] ABSTRACT

A connector terminal checking device of the present invention comprises a base plate, a checking body movably mounted on the base plate, and a connector holder fixed onto the base plate, wherein the checking body further comprises a plurality of check pins aligned facing toward the connector holder, and the connector holder is provided with a terminal holding wall formed with a plurality of terminal position regulating sections, each for receiving a corresponding one of a plurality of terminal accommodating chambers of a connector to be checked, and also provided with a pair of connector sustainers shiftably urged by way of a resilient stuff, wherein by shifting the checking body toward the connector installed in the connector holder to bring the terminals in the connector into contact with the check pins, the terminals improperly inserted in the accommodating chamber are abutted against the terminal position regulating section and shifted to the properly inserted position.

4 Claims, 5 Drawing Sheets

CONNECTOR TERMINAL CHECKING DEVICE

BACKGROUND OF THE INVENTION

1. Field of the Invention

The present invention relates to a checking device for checking connector terminals inserted in connectors used for interconnecting wiring cables or the like distributed in automotive vehicles, and more particularly to a connector checking device to detect whether the terminal is properly inserted and in an electrically good conductive state.

2. Description of the Prior Art

In the connectors used for wiring distributions, a male or female connector terminal inserted in a connector housing is generally guided into a terminal accommodating chamber and locked by a locking piece such as a lance or a casing lance provided in the connector housing for preventing the thus inserted connector terminal from coming off rearwardly.

In case the connector terminal is not in a proper position (in other words, not in a fully inserted position) in the terminal accommodating chamber, the terminal is not locked by a locking piece, whereby if a drawing force is applied to a cable connected to the terminal, the terminal is drawn backward to come off from the rear end of the connector housing, resulting in a bad electrical conductive state in case it is connected with another connector.

In order to overcome the forgoing drawback, there has been proposed a connector terminal checking device for checking whether a terminal is properly inserted in a predetermined position and locked by a locking piece provided in a terminal accommodating chamber, a case in point being the one as shown in FIG. 6 by reference character "M", as is disclosed in Japanese Patent Application Laid-Open No. 6-45042.

The connector terminal checking device M is composed by movably mounting a connector holder b and a checking body c on a base plate a, wherein the checking body c is shifted back and forth in accordance with a rotational movement of an operation lever d mounted at one side of the checking body C.

A receiving rest e provided on the bottom of the connector holder b is, as shown in FIG. 7, formed with two upright terminal holding pins f, whereas an opening for receiving a connector provided at the front portion of checking body c is formed with a plurality of check pins h. Further, a housing i holding the connector K to be checked is formed with a pair of receiving holes i into which the terminal holding pins f are inserted.

For checking the connector K using the connector terminal checking device M, first the connector K is placed in the connector holder b downwardly from above and fixed by inserting the terminal pins f of the connector holder into the receiving holes i thereof. Thereafter, by rotating the operation lever toward the connector holder, the checking body c is advanced to be brought into contact with the connector K, and by further movement of the checking body, the check pins h are pressed against terminals T (refer to FIG. 10) to be pushed backward. By detecting this backward movement of the check pins h, an electrical circuit provided in the checking body c is electrically activated and the proper insertion of the terminals T is thereby confirmed.

In this case above, if each of the terminals T is not properly inserted in a terminal accommodating chamber n of the connector housing i, as shown in FIG. 10, the terminal holding pin f is abutted against the tapered shoulder portion m of the terminal T, whereby the connector housing i advances in response to the forward movement of the checking body c, and the terminal T is thereby shifted relatively inside the terminal accommodating chamber n to finally reach to its predetermined proper position and locked properly.

Accordingly, by using the connector terminal checking device M, even though there is a terminal in an imperfectly inserted state within the connector housing, it is automatically corrected and set in its properly inserted position in response to the shifting movement of the checking body c, making thereby possible a perfect insertion of the terminal T simultaneously with the connector terminal checking operation.

However, for using this connector terminal checking device M, it is necessary to provide receiving holes i in the connector housing into which the terminal holding pins f are respectively inserted, and in addition, it is inevitable to make the terminal holding pins f quite large to provide a substantial strength thereto and also substantial mutual space therebetween for shifting the terminal T, so that it is not applicable to a water-proofing connector in which such receiving holes j can not be formed due to its water-proofing purpose, and either to a so-called high-density connector having a very fine pitch between terminals.

The present invention is made for solving the above problem, and it is an object of the present invention to provide a connector terminal checking device which is capable of automatically correcting an improper insertion of a connector terminal in the terminal accommodating chamber of a connector to be checked, which can also be applied to check a water-proofing connector, a high-density connector and so forth.

SUMMARY OF THE INVENTION

In order to accomplish the above object, the present invention provides a connector terminal checking device comprising a base plate, a checking body movably mounted on the base plate, and a connector holder fixed onto the base plate, wherein the checking body further comprises a plurality of check pins aligned facing toward the connector holder, and the connector holder is provided with a terminal holding wall formed with a plurality of terminal position regulating sections, each for receiving a corresponding one of a plurality of terminal accommodating chambers of a connector to be checked, and also provided with a pair of connector sustainers shiftably urged by way of a resilient stuff, wherein by making the checking body approach to the connector installed in the connector holder so as to bring the terminals in the connector into contact with the check pins to be electrically connected, and also shifting the connector thereby, the terminals improperly inserted in the accommodating chamber are abutted against the terminal position regulating section and shifted to the properly inserted position.

Further, each of the terminal position regulating sections is formed in a groove-like shape formed in the terminal holding wall, and each of the connector sustainers is provided with a pair of slide pins, each inserted in a corresponding one of slide pin receiving holes formed in the terminal holding wall, wherein the each connector sustainer is urged by a spring provided in each of the pin receiving holes.

Since the connector terminal checking device of the present invention is composed such that the connector holder is provided with a terminal holding wall which is further formed with a plurality of terminal position regulating sections each for receiving a corresponding one of the position of terminal accommodating chambers of the connector to be checked, and the connector is supported by each of the connector sustainers by way of a resilient stuff, even though there are terminals badly inserted in the terminal accommodating chambers, they are automatically shifted to their perfectly inserted state by a shifting movement of the connector in response to the movement of the checking body.

Further, since the terminal position regulating sections are readily formed just in consideration for the position of the terminal accommodating chambers of a connector to be checked, a connector having a very fine pitch between the terminals or a multiple-electrode terminal can also be checked by this device, so that it is applicable to a so-called high-density connector. Besides, since it is no longer necessary to form a through hole in the connector housing for the checking operation, even a water-proofing connector can also be checked by this terminal checking device.

Other features and advantages of the invention will be apparent from the following description taken in connection with the accompanying drawing.

DETAILED DESCRIPTION OF THE PREFERRED EMBODIMENTS

In the following, one embodiment of the present invention is explained.

Figure 1:
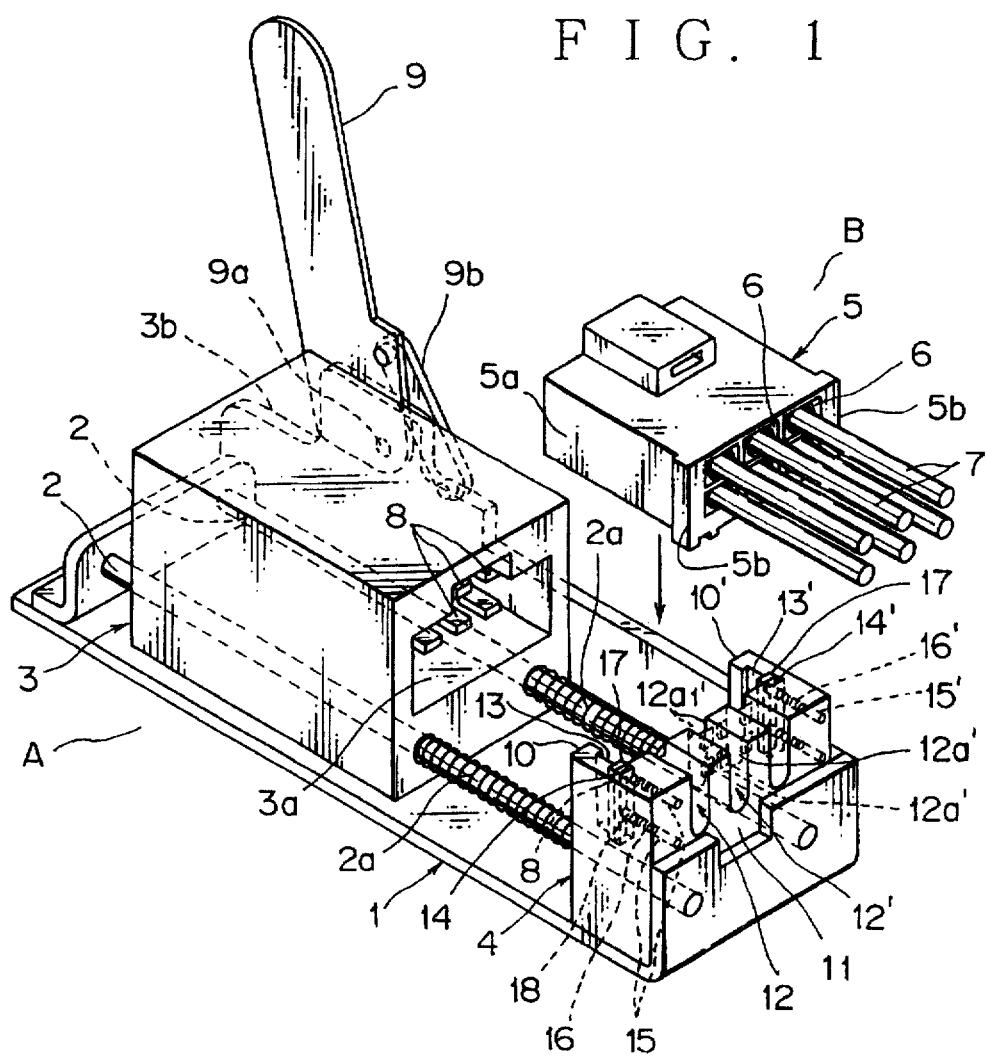
FIG. 1 is a perspective view of a connector terminal checking device of the present invention and a connector to be checked.

FIG. 1 is a perspective view showing a connector terminal checking device A according to the present invention and a connector B to be checked thereby.

The connector terminal checking device A is composed of a checking body 3 movably provided on a pair of rails 2 mounted on a base plate 1, and a connector holder 4 fixed onto the base plate 1.

The connector housing B comprises a plurality of terminal accommodating chambers 6 in the housing 5 thereof, and accommodated in the terminal accommodating chambers 6 are a plurality of female terminals C (refer to FIG. 4) each having a cable 7 connected thereto. On the peripheral wall 5a of the housing at the cable-connected side, a flange 5b (5b') is protruded from the opposite lateral sides.

The checking body 3 is provided with a connector receiving hole 3a in which a plurality of check pins 8 are aligned in a protruded manner toward the connector holder 4. Each of these check pins 8 is connected with a checking circuit (not shown) preinstalled in the checking body 3 for checking whether it is electrically conducted when brought into contact with the corresponding opposing connector terminal C.

One of the lateral sides of the base plate 1 is formed with a supporting wall 3b, and the operation lever 9 is mounted on it in a rotatable manner pivoting at the fulcrum 9a of the operation lever 9. The operation lever 9 is connected with the checking body 3 by way of a connection rod 9b, whereby the checking body 3 is moved toward the connector holder 4 along the rails 2 in accordance with a rotational movement of the operation lever. Each of the rails 2 is engageably provided with a spring 2a between the checking body 3 and the connector holder 4 so as to urge the checking body 3 in the direction parting from the connector holder 4.

The connector holder 4 is formed with a pair of walls 10, 10' each at laterally opposite sides thereof for receiving the housing 5 of the connector B to be checked, and a terminal holding wall 11 is provided between these walls 10 and 10'. This terminal holding wall 11 is formed with a plurality of groove-like terminal position regulating sections 12 for receiving each terminal C at a position corresponding to the position of the terminal accommodating chamber 6 of the connector B.

These terminal position regulating sections 12 are formed in a groove-like shape having a gap a bit wider than the diameter of the cable 7 in order that the corner sections 12a1, 12a1' of the respective inner wall surfaces 12a, 12a' abut against the terminal C and firmly hold it. Inner surfaces of the respective walls 10, 10' of the connector holder 4 are formed with connector mounting grooves 13, 13' and holder accommodating grooves 14, 14' in a stepped manner.

At each of the opposite end portions of the terminal holding wall 11 respectively in contact with the holder accommodating groove 14 (14'), a pair of vertically aligned slide pin receiving holes 15, 15 (15', 15') are formed in parallel with the respective rails 2, and slide pins 18, 18 (18', 18') provided to the connector sustainer 17 (17') are slidably moved into the slide pin receiving holes 15, 15 (15', 15').

The connector sustainer 17 (17') is provided for resiliently protecting the flange 5b (5b') of the opposite sides of the housing 5 of the connector B from the opposite ends of the terminal holding wall 11, wherein the connector sustainer 17 (17') is provided with the pair of pins 18, 18 (18', 18'), and is always urged toward the checking body 3 by slidably mounting them into the pin receiving holes 15, 15 (15', 15') of the terminal holding wall 11 by way of the springs 16, 16 (16', 16').

The procedure for checking the connector B by use of the connector terminal checking device A is now explained as below.

Figure 2:
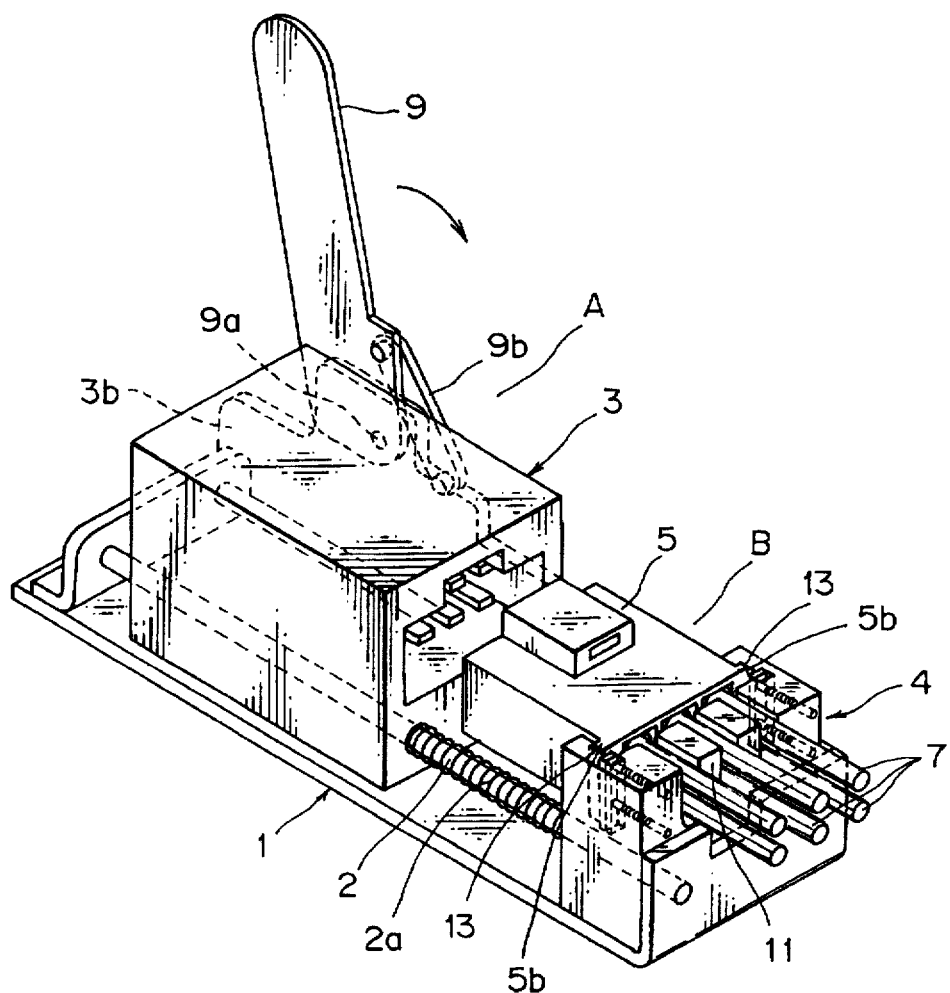
FIG. 2 is a perspective view showing a state that the connector of FIG. 1 is placed on the connector holder.

As shown in FIG. 2, first insert the flange 5b (5b') provided at each side of the housing 5 of the connector B into the connector accommodating groove 13 (13') formed on the side wall 10 (10') of the connector holder 4. In this state, the flange 5b (5b') is urged by the connector sustainer 17 (17') toward the checking body 3.

Thereafter, by rotating the operation lever 9 in the direction indicated by an arrow as shown in FIG. 2 and make the checking body 3 approach to the connector B, the check pins 8 of the checking body 3 and the terminal C are brought into contact with each other, so that the circuit within the checking body 3 is electrically conducted to execute the detection.

Figure 4:
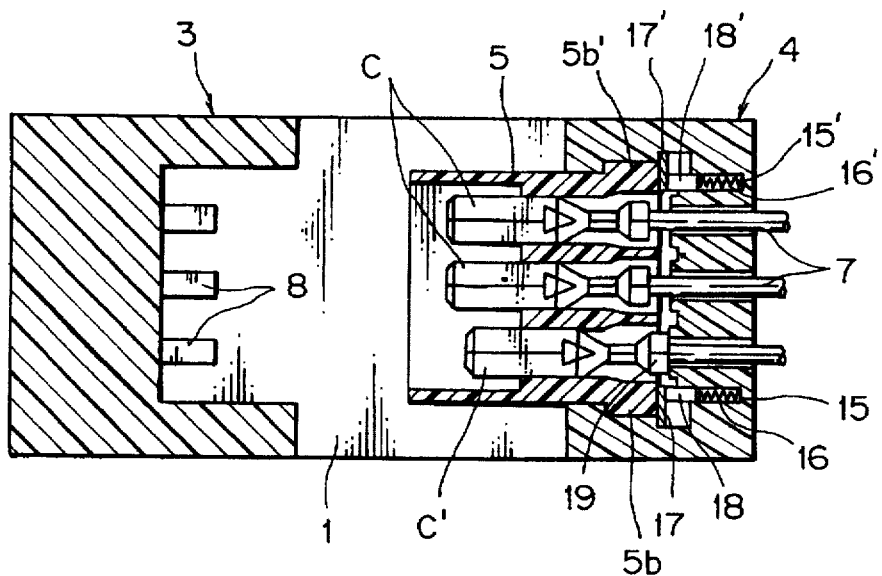
FIG. 4 is an explanatory view of terminals held in the connector which is set on the connector holder.

In the state of FIG. 2, if an improperly inserted terminal C' exists in the connector B as shown in FIG. 4, the check pin 8 and the terminal C' are not brought into a mutual contact, and thus they will not be in an electrically conductive state.

Figure 5:
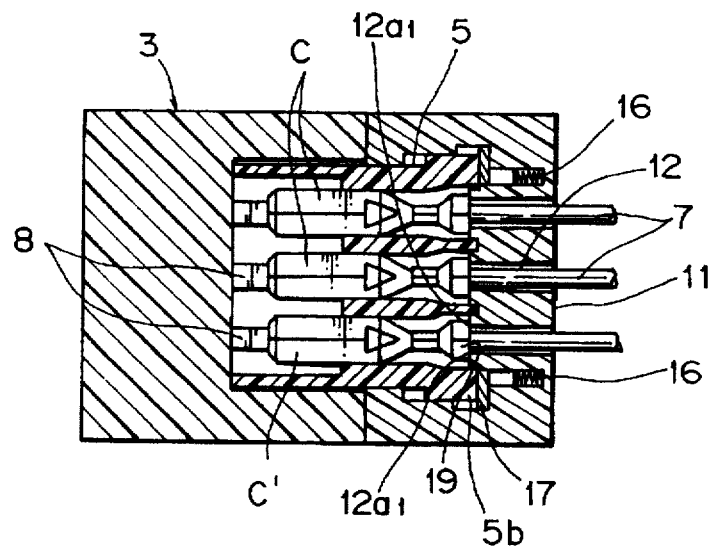
FIG. 5 is an explanatory view showing a state that the check pins of the checking body and the terminals are brought into contact with each other.
Figure 3:
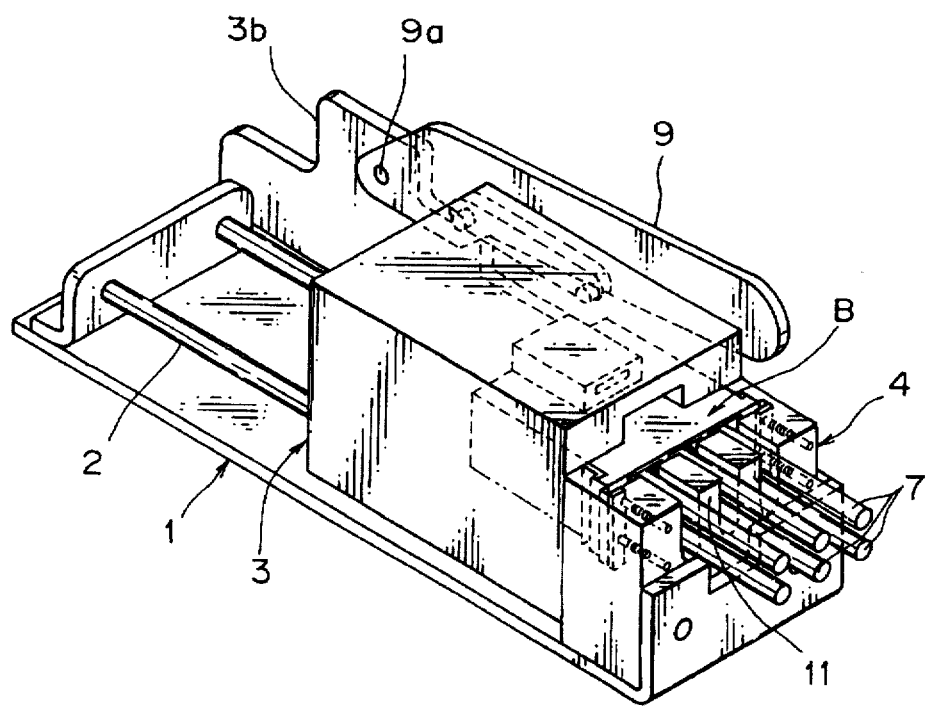
FIG. 3 is a perspective view showing a state that the operation lever of FIG. 2 is rotated to make the checking body approach to the connector.
Figure 6:
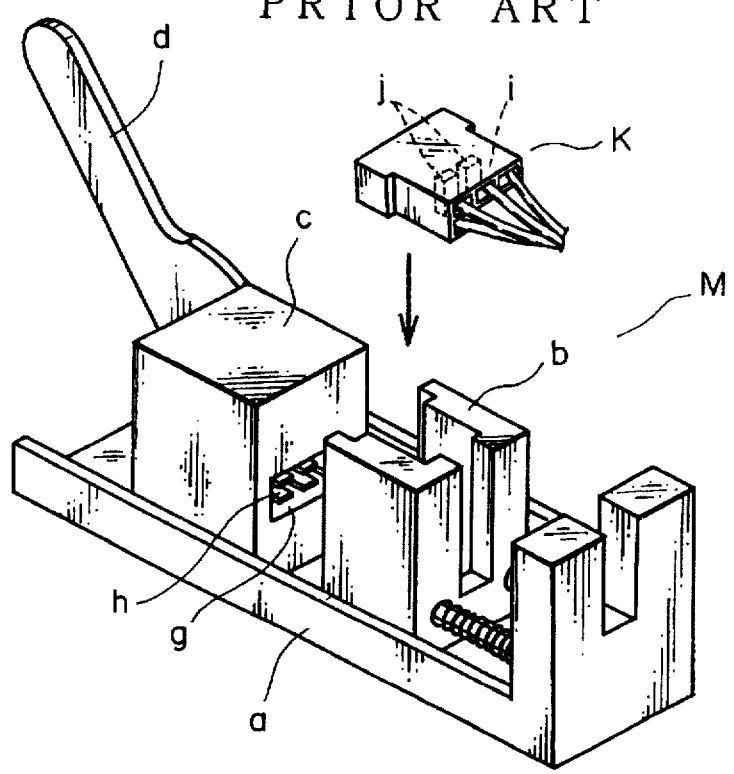
FIG. 6 is a perspective view of a conventionally used connector terminal checking device.
Figure 7:
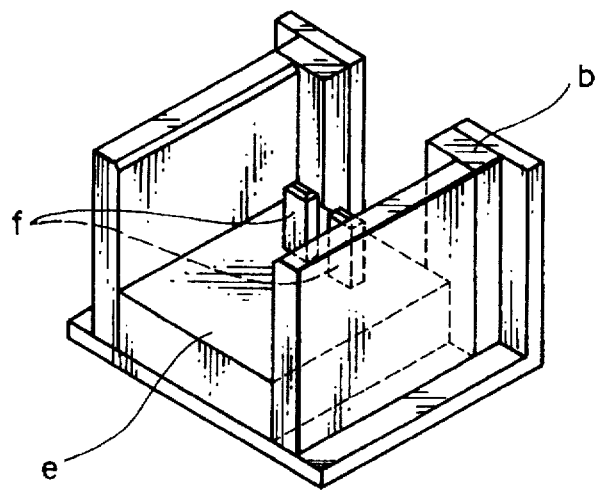
FIG. 7 is a perspective view of a pair of terminal holding pins mounted upright on the checking body.
Figure 8:
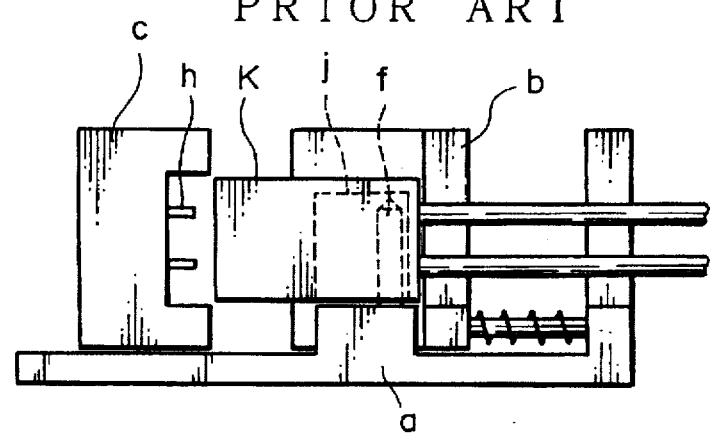
FIG. 8 is an explanatory view showing a procedure for checking the connector by the conventional connector terminal checking device of FIG. 6.
Figure 9:
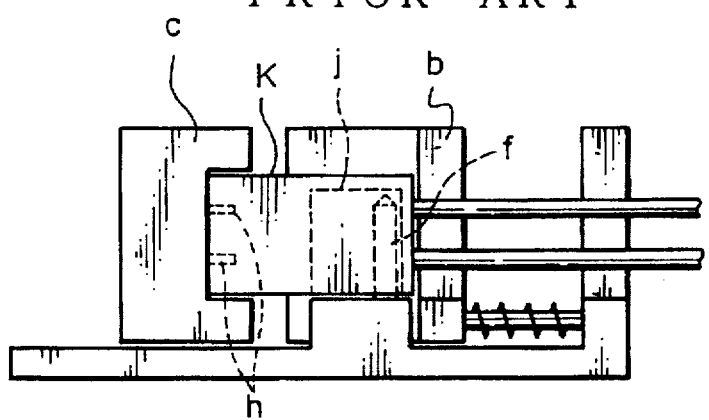
FIG. 9 is an explanatory view showing a state that the checking body of FIG. 8 is made approached to the connector.
Figure 10:
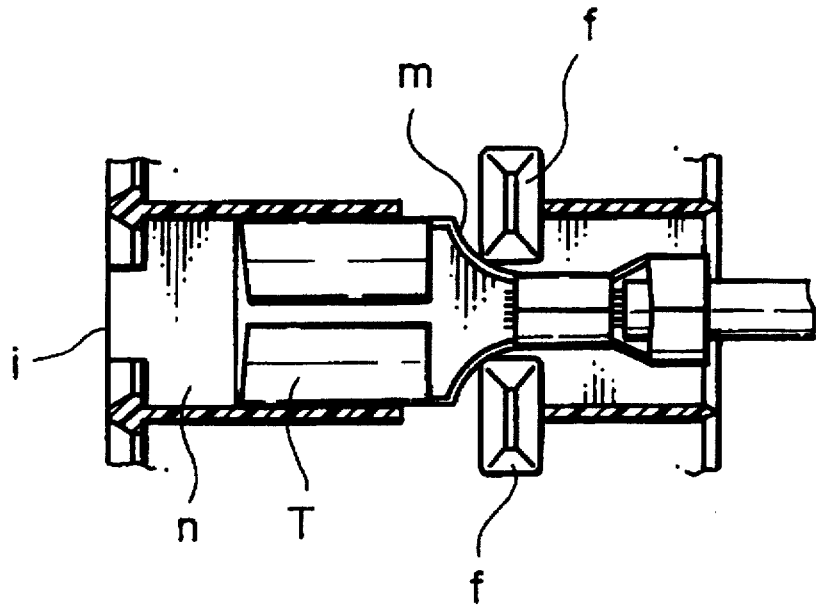
FIG. 10 is an explanatory view of the terminals which are in an imperfectly inserted state in the terminal accommodating chamber of the connector of FIG. 6.
Figure 11:
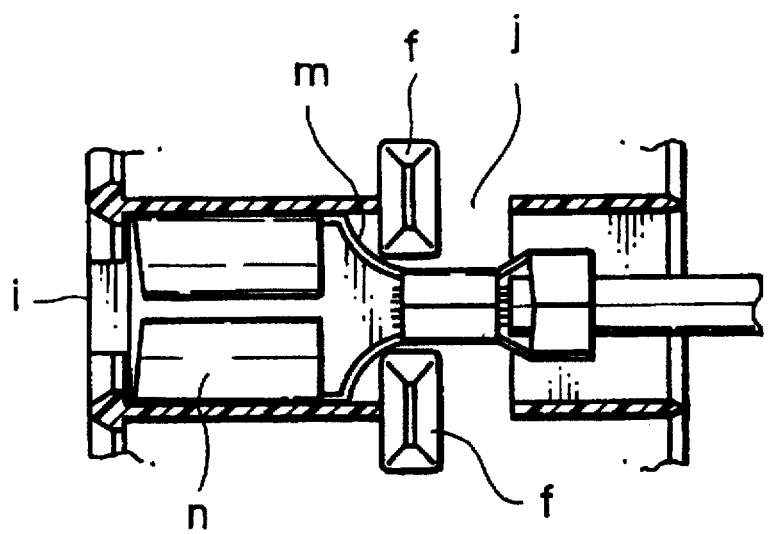
FIG. 11 is an explanatory view showing a state that the terminal in the imperfectly inserted state are shifted to the perfectly inserted state in response to the movement of the terminal of FIG. 10.

However, if the rotation lever 9 is rotated in the direction indicated by an arrow (FIG. 2) and the checking body 3 is brought close to the connector B, the checking body 3 then, as shown in FIG. 5, pushes the housing 5 of the connector B and shifts the connector B toward the terminal holding wall 11 against the urging force of the spring 16. In accordance with the shifting movement of the checking body 3, the cable connecting portion 19 of the terminal C' and the corner portions 12a1, 12a1' of the terminal position regulating section 12 of the terminal holding wall 11 are abutted against each other, so that the terminal C' is moved to its perfectly inserted state in the terminal accommodating chamber 6, and the terminal C' is electrically connected with the corresponding predetermined check pin 8.

[Effect of the Invention]

As explained heretofore, with the connector terminal checking device of the present invention, even though there are terminals badly inserted in the terminal accommodating chambers of a connector to be checked, they are automatically shifted to their perfectly inserted state by a shifting movement of the connector in response to the movement of the checking body.

Further, since the terminal position regulating sections provided on the terminal holding wall are readily formed just in consideration for the position of the terminal accommodating chambers of the connector to be checked, a connector having a very fine pitch between the terminals or a multiple-electrode terminal can also be checked by this device, so that it is applicable to a so-called high-density connector. Besides, since it is no longer necessary to form a through hole in the connector housing for the checking operation, even a water-proofing connector can also be checked by this terminal checking device.

What is claimed is:

1. A connector terminal checking device comprising a base plate, a checking body movably mounted on the base plate, and a connector holder fixed onto the base plate, wherein said checking body further comprises a plurality of check pins aligned facing toward said connector holder, and said connector holder is provided with a terminal holding wall formed with a plurality of terminal position regulating sections, each for receiving a corresponding one of a plurality of terminal accommodating chambers of a connector to be checked, and also provided with a pair of connector sustainers shiftably urged by way of a resilient stuff, wherein by making said checking body approach to the connector installed in said connector holder to bring the terminals in the connector into contact with said check pins to be electrically connected, and also shifting the connector thereby, the terminals improperly inserted in the accommodating chamber are abutted against said terminal position regulating section and shifted to the properly inserted position.

2. A connector terminal checking device as claimed in claim 1, each of said terminal position regulating sections is formed in a groove-like shape formed in said terminal holding wall, and each of said connector sustainer is provided with a pair of slide pins, each inserted in a corresponding one of slide pin receiving holes formed in said terminal holding wall, wherein each said connector sustainer is urged by a spring provided in each of said pin receiving holes.

3. A connector terminal checking device as claimed in claim 2, wherein said pair of slide pins are vertically aligned with each other in parallel with a pair of rails mounted on said base plate along which said checking body is moved back and forth.

4. A method of checking connector terminals by use of a connector terminal checking device comprising a base plate, a checking body movably mounted on the base plate and having an operation lever, and a connector holder fixed onto the base plate, wherein said checking body further comprises a plurality of check pins aligned facing toward said connector holder, and said connector holder is provided with a terminal holding wall formed with a plurality of terminal position regulating sections, each for receiving a corresponding one of a plurality of terminal accommodating chambers of a connector to be checked, and also provided with a pair of connector sustainers shiftably urged by way of a resilient stuff, said method comprising the steps of:

installing a connector terminal to be checked within said connector holder;

rotating said operation lever to make said checking body approach to the connector in said connector holder and bring the terminals in the connector into contact with said check pins to be electrically connected, shifting the connector thereby, and bringing the terminals improperly inserted in the accommodating chamber, if any, to be abutted against said terminal position regulating section and shifted to the properly inserted position.

* * * * *